United States Patent
Zhang et al.

(10) Patent No.: US 8,707,141 B1
(45) Date of Patent: Apr. 22, 2014

(54) JOINT OPTIMIZATION OF PACKETIZATION AND ERROR CORRECTION FOR VIDEO COMMUNICATION

(75) Inventors: Rui Zhang, Pleasanton, CA (US); Qiyong Liu, Zhejiang (CN); Bo Ling, Hangzhou (CN); Siping Tao, Anhui (CN)

(73) Assignee: Cisco Technology, Inc., San Jose, CA (US)

( * ) Notice: Subject to any disclaimer, the term of this patent is extended or adjusted under 35 U.S.C. 154(b) by 202 days.

(21) Appl. No.: 13/196,359

(22) Filed: Aug. 2, 2011

(51) Int. Cl.
*H03M 13/00* (2006.01)

(52) U.S. Cl.
USPC ...... 714/776; 714/757; 714/752; 375/240.07; 375/240.01; 375/240.27; 375/240.05; 375/240.02; 463/42; 345/156

(58) Field of Classification Search
None
See application file for complete search history.

(56) References Cited

U.S. PATENT DOCUMENTS

| | | | |
|---|---|---|---|
| 6,556,588 B2 | 4/2003 | Wan et al. | |
| 6,891,854 B2 | 5/2005 | Zhang et al. | |
| 6,918,069 B2 | 7/2005 | Grandi et al. | |
| 6,965,646 B1 | 11/2005 | Firestone | |
| 6,999,417 B1 | 2/2006 | Graham et al. | |
| 7,328,393 B2 | 2/2008 | Chawla et al. | |
| 7,570,643 B2 | 8/2009 | Prasad et al. | |
| 7,681,101 B2 | 3/2010 | Oran et al. | |
| 7,688,741 B2 | 3/2010 | Botton-Dascal et al. | |
| 7,746,853 B2 | 6/2010 | Zhang | |
| 7,817,734 B2 | 10/2010 | Subramanyam et al. | |
| 7,848,337 B1 | 12/2010 | Weng et al. | |
| 7,924,815 B2 | 4/2011 | McRae et al. | |
| 7,930,616 B2 | 4/2011 | Gerstel et al. | |
| 7,940,777 B2 | 5/2011 | Asati et al. | |
| 7,957,423 B2 | 6/2011 | Crookes et al. | |
| 7,957,642 B2 | 6/2011 | Loprieno | |
| 7,965,771 B2 | 6/2011 | Wu et al. | |
| 2008/0134005 A1* | 6/2008 | Izzat et al. | 714/774 |
| 2008/0253369 A1 | 10/2008 | Oran et al. | |
| 2008/0259968 A1 | 10/2008 | Forghieri et al. | |

(Continued)

OTHER PUBLICATIONS

Tsuchimoto, et al., "Bandwidth Adjustable DVTS on the Heterogeneous Internet Environments for Distance Learning," Proceedings of the 2007 International Symposium on Applications and the Internet Workshops (SAINTW'07), IEEE, Apr. 2007.

(Continued)

*Primary Examiner* — John Trimmings
(74) *Attorney, Agent, or Firm* — Edwards Wildman Palmer LLP; James M. Behmke; Stephen D. LeBarron

(57) ABSTRACT

In one embodiment, a process determines a size of a video unit (e.g., frame) to transmit from a sender to a receiver across a communication channel for an associated video stream, and also determines an updated packet loss rate on the channel. In response, the process may dynamically determine both a number N of video data packets and a number M of forward error correction (FEC) packets to transmit for the video unit based on the size of the video unit, the updated packet loss rate on the channel, and an error resilience requirement for the video stream. In an illustrative embodiment, N and M are determined during transmission of the video stream through a look-up operation into a table indexed by the size of the video unit and the updated packet loss rate as co-indices, the co-indices co-indexing a pre-determined N and M pair.

23 Claims, 23 Drawing Sheets

(56) References Cited

U.S. PATENT DOCUMENTS

| | | |
|---|---|---|
| 2009/0201805 A1 | 8/2009 | Begen et al. |
| 2009/0213927 A1* | 8/2009 | Perlman et al. .......... 375/240.02 |
| 2010/0017685 A1* | 1/2010 | Huang ......................... 714/774 |
| 2010/0104025 A1* | 4/2010 | Rose et al. ............... 375/240.27 |
| 2010/0125768 A1 | 5/2010 | Mauchly et al. |
| 2010/0157788 A1 | 6/2010 | Ellis et al. |
| 2010/0166062 A1* | 7/2010 | Perlman et al. .......... 375/240.05 |
| 2010/0166064 A1* | 7/2010 | Perlman et al. .......... 375/240.07 |
| 2011/0122063 A1* | 5/2011 | Perlman et al. ................ 345/161 |
| 2012/0149476 A1* | 6/2012 | Perlman et al. ................. 463/42 |

OTHER PUBLICATIONS

Sankarasubramaniam, et al., "Energy Efficiency based Packet Size Optimization in Wireless Sensor Networks," IEEE International Workshop on Sensor Network Protocols and Applications, Jun. 11, 2003.

Frantti, T., "Fuzzy Packet Size Optimization for Delay Sensitive Traffic in Ad Hoc Networks," IEEE 20th International Symposium on Personal, Indoor and Mobile Radio Communications, Sep. 13, 2009.

* cited by examiner

TABLE 1:
PERFORMANCE COMPARISON BETWEEN
SHORTER CODE AND LONGER CODE

| PACKET LOSS RATE | N | M | FRAME LOSS RATE |
|---|---|---|---|
| 5% | 2 | 1 | 0.725% |
| 5% | 4 | 2 | 0.223% |
| 5% | 10 | 5 | 0.0053% |
| 10% | 2 | 1 | 2.8% |
| 10% | 4 | 2 | 1.585% |
| 10% | 10 | 5 | 0.225% |
| 20% | 2 | 1 | 10.4% |
| 20% | 4 | 2 | 9.888% |
| 20% | 10 | 5 | 6.1051% |

FIG. 7

TABLE 2:
FEC DESIGN BASED ON FIXED DATA PACKETIZATION

| PACKET LOSS RATE | N | M | OVERHEAD (M/N) | FRAME LOSS RATE |
|---|---|---|---|---|
| 5% | 2 | 2 | 100% | 0.0481% |
| 5% | 3 | 2 | 67% | 0.1158% |
| 5% | 4 | 2 | 50% | 0.2230% |
| 5% | 5 | 3 | 60% | 0.0372% |
| 10% | 2 | 3 | 150% | 0.0460% |
| 10% | 3 | 3 | 100% | 0.1270% |
| 10% | 4 | 3 | 75% | 0.2728% |
| 10% | 5 | 4 | 80% | 0.0891% |
| 20% | 2 | 4 | 200% | 0.0002% |
| 20% | 3 | 5 | 167% | 0.1231% |
| 20% | 4 | 6 | 150% | 0.0864% |
| 20% | 5 | 6 | 120% | 0.1965% |

FIG. 8

TABLE 3:
COMPARISON BETWEEN DYNAMIC PACKETIZATION
AND FIXED DATA PACKETIZATION (1000 BYTES FOR FIXED)

| VIDEO SIZE | LOSS RATE | FIXED PACK | | PROPOSED PACK | | FRAME LOSS RATE |
|---|---|---|---|---|---|---|
| | | N | M | N | M | |
| 500 | 0% | 1 | 0 | 1 | 0 | 0% |
| 500 | 5% | 1 | 1 | 1 | 1 | 0% |
| 500 | 10% | 1 | 2 | 4 | 3 | 13% |
| 500 | 15% | 1 | 3 | 2 | 3 | 27% |
| 500 | 20% | 1 | 3 | 2 | 4 | 12% |
| 500 | 25% | 1 | 4 | 3 | 6 | 20% |
| 1000 | 0% | 1 | 0 | 1 | 0 | 0% |
| 1000 | 5% | 1 | 1 | 4 | 2 | 5% |
| 1000 | 10% | 1 | 2 | 4 | 3 | 26% |
| 1000 | 15% | 1 | 3 | 6 | 5 | 33% |
| 1000 | 20% | 1 | 3 | 5 | 6 | 25% |
| 1000 | 25% | 1 | 4 | 6 | 8 | 32% |
| 1500 | 0% | 2 | 0 | 2 | 0 | 0% |
| 1500 | 5% | 2 | 2 | 4 | 2 | 15% |
| 1500 | 10% | 2 | 3 | 4 | 3 | 22% |
| 1500 | 15% | 2 | 3 | 6 | 5 | 9% |
| 1500 | 20% | 2 | 4 | 5 | 6 | 14% |
| 1500 | 25% | 2 | 5 | 6 | 8 | 18% |
| 2000 | 0% | 2 | 0 | 2 | 0 | 0% |
| 2000 | 5% | 2 | 2 | 4 | 2 | 18% |
| 2000 | 10% | 2 | 3 | 4 | 3 | 24% |
| 2000 | 15% | 2 | 3 | 6 | 5 | 13% |
| 2000 | 20% | 2 | 4 | 7 | 7 | 18% |
| 2000 | 25% | 2 | 5 | 6 | 8 | 21% |

FIG. 9A

| VIDEO SIZE | LOSS RATE | FIXED PACK N | FIXED PACK M | PROPOSED PACK N | PROPOSED PACK M | FRAME LOSS RATE |
|---|---|---|---|---|---|---|
| 2500 | 0% | 3 | 0 | 2 | 0 | 4% |
| 2500 | 5% | 3 | 2 | 4 | 2 | 7% |
| 2500 | 10% | 3 | 3 | 7 | 4 | 10% |
| 2500 | 15% | 3 | 4 | 6 | 5 | 13% |
| 2500 | 20% | 3 | 5 | 7 | 7 | 14% |
| 2500 | 25% | 3 | 6 | 9 | 10 | 15% |
| 3000 | 0% | 3 | 0 | 3 | 0 | 0% |
| 3000 | 5% | 3 | 2 | 4 | 2 | 7% |
| 3000 | 10% | 3 | 3 | 7 | 4 | 12% |
| 3000 | 15% | 3 | 4 | 6 | 5 | 14% |
| 3000 | 20% | 3 | 5 | 9 | 8 | 16% |
| 3000 | 25% | 3 | 6 | 9 | 10 | 17% |
| 3500 | 0% | 4 | 0 | 3 | 0 | 3% |
| 3500 | 5% | 4 | 2 | 4 | 2 | 0% |
| 3500 | 10% | 4 | 3 | 7 | 4 | 3% |
| 3500 | 15% | 4 | 5 | 6 | 5 | 14% |
| 3500 | 20% | 4 | 6 | 9 | 8 | 15% |
| 3500 | 25% | 4 | 7 | 9 | 10 | 13% |
| 4000 | 0% | 4 | 0 | 3 | 0 | 2% |
| 4000 | 5% | 4 | 2 | 9 | 3 | 1% |
| 4000 | 10% | 4 | 3 | 7 | 4 | 4% |
| 4000 | 15% | 4 | 5 | 11 | 7 | 16% |
| 4000 | 20% | 4 | 6 | 9 | 8 | 16% |

TABLE 4:
COMPARISON BETWEEN DYNAMIC PACKETIZATION
AND FIXED DATA PACKETIZATION (500 BYTES FOR FIXED)

| VIDEO SIZE | LOSS RATE | FIXED PACK | | PROPOSED PACK | | BANDWIDTH SAVINGS |
|---|---|---|---|---|---|---|
| | | N | M | N | M | |
| 500 | 0% | 1 | 0 | 1 | 0 | 0% |
| 500 | 5% | 1 | 1 | 1 | 1 | 0% |
| 500 | 10% | 1 | 2 | 4 | 3 | 13% |
| 500 | 15% | 1 | 3 | 2 | 3 | 27% |
| 500 | 20% | 1 | 3 | 2 | 4 | 12% |
| 500 | 25% | 1 | 4 | 3 | 6 | 20% |
| 1000 | 0% | 2 | 0 | 1 | 0 | 8% |
| 1000 | 5% | 2 | 2 | 4 | 2 | 12% |
| 1000 | 10% | 2 | 3 | 4 | 3 | 18% |
| 1000 | 15% | 2 | 3 | 6 | 5 | 2% |
| 1000 | 20% | 2 | 4 | 5 | 6 | 8% |
| 1000 | 25% | 2 | 5 | 6 | 8 | 11% |
| 1500 | 0% | 3 | 0 | 2 | 0 | 6% |
| 1500 | 5% | 3 | 2 | 4 | 2 | 5% |
| 1500 | 10% | 3 | 3 | 4 | 3 | 8% |
| 1500 | 15% | 3 | 4 | 6 | 5 | 8% |
| 1500 | 20% | 3 | 5 | 5 | 6 | 8% |
| 1500 | 25% | 3 | 6 | 6 | 8 | 9% |
| 2000 | 0% | 4 | 0 | 2 | 0 | 8% |
| 2000 | 5% | 4 | 2 | 4 | 2 | 0% |
| 2000 | 10% | 4 | 3 | 4 | 3 | 0% |
| 2000 | 15% | 4 | 5 | 6 | 5 | 12% |
| 2000 | 20% | 4 | 6 | 7 | 7 | 10% |
| 2000 | 25% | 4 | 7 | 6 | 8 | 8% |

FIG. 10A

| VIDEO SIZE | LOSS RATE | FIXED PACK | | PROPOSED PACK | | BANDWIDTH SAVINGS |
| --- | --- | --- | --- | --- | --- | --- |
| | | N | M | N | M | |
| 2500 | 0% | 5 | 0 | 2 | 0 | 10% |
| 2500 | 5% | 5 | 3 | 4 | 2 | 9% |
| 2500 | 10% | 5 | 4 | 7 | 4 | 7% |
| 2500 | 15% | 5 | 5 | 6 | 5 | 5% |
| 2500 | 20% | 5 | 6 | 7 | 7 | 3% |
| 2500 | 25% | 5 | 8 | 9 | 10 | 8% |
| 3000 | 0% | 6 | 0 | 3 | 0 | 8% |
| 3000 | 5% | 6 | 3 | 4 | 2 | 6% |
| 3000 | 10% | 6 | 4 | 7 | 4 | 3% |
| 3000 | 15% | 6 | 5 | 6 | 5 | 0% |
| 3000 | 20% | 6 | 7 | 9 | 8 | 5% |
| 3000 | 25% | 6 | 8 | 9 | 10 | 2% |
| 3500 | 0% | 7 | 0 | 3 | 0 | 9% |
| 3500 | 5% | 7 | 3 | 4 | 2 | 2% |
| 3500 | 10% | 7 | 4 | 7 | 4 | 0% |
| 3500 | 15% | 7 | 6 | 6 | 5 | 4% |
| 3500 | 20% | 7 | 7 | 9 | 8 | 1% |
| 3500 | 25% | 7 | 9 | 9 | 10 | 3% |
| 4000 | 0% | 8 | 0 | 3 | 0 | 10% |
| 4000 | 5% | 8 | 3 | 9 | 3 | 1% |
| 4000 | 10% | 8 | 5 | 7 | 4 | 5% |
| 4000 | 15% | 8 | 6 | 11 | 7 | 1% |
| 4000 | 20% | 8 | 8 | 9 | 8 | 3% |
| 4000 | 20% | 8 | 10 | 9 | 10 | 4% |

FIG. 10B

TABLE 5:
COMPARISON BETWEEN DYNAMIC PACKETIZATION
AND FIXED DATA PACKETIZATION FOR JOINT UPLINK/DOWNLINK
CONSIDERATION, ALL DOWNLINKS EQUAL WEIGHTED TO ONE
(1000 BYTES FOR FIXED)

| VIDEO SIZE | LOSS RATE | FIXED PACK | | PROPOSED PACK | | BANDWIDTH SAVINGS |
| --- | --- | --- | --- | --- | --- | --- |
| | | N | M | N | M | |
| 500 | 0% | 1 | 0 | 2 | 0 | 10% |
| 500 | 5% | 1 | 1 | 3 | 2 | 9% |
| 500 | 10% | 1 | 2 | 3 | 3 | 11% |
| 500 | 15% | 1 | 3 | 2 | 3 | 14% |
| 500 | 20% | 1 | 3 | 2 | 4 | 11% |
| 500 | 25% | 1 | 4 | 3 | 6 | 13% |
| 1000 | 0% | 1 | 0 | 3 | 0 | 19% |
| 1000 | 5% | 1 | 1 | 4 | 2 | 20% |
| 1000 | 10% | 1 | 2 | 4 | 3 | 22% |
| 1000 | 15% | 1 | 3 | 3 | 4 | 23% |
| 1000 | 20% | 1 | 3 | 4 | 6 | 21% |
| 1000 | 25% | 1 | 4 | 4 | 7 | 23% |
| 1500 | 0% | 2 | 0 | 6 | 0 | 8% |
| 1500 | 5% | 2 | 2 | 4 | 2 | 10% |
| 1500 | 10% | 2 | 3 | 6 | 4 | 12% |
| 1500 | 15% | 2 | 3 | 6 | 5 | 10% |
| 1500 | 20% | 2 | 4 | 6 | 7 | 11% |
| 1500 | 25% | 2 | 5 | 6 | 8 | 12% |
| 2000 | 0% | 2 | 0 | 6 | 0 | 12% |
| 2000 | 5% | 2 | 2 | 6 | 3 | 14% |
| 2000 | 10% | 2 | 3 | 7 | 4 | 15% |
| 2000 | 15% | 2 | 3 | 6 | 5 | 14% |
| 2000 | 20% | 2 | 4 | 7 | 7 | 15% |
| 2000 | 25% | 2 | 5 | 6 | 8 | 16% |

FIG. 11A

| VIDEO SIZE | LOSS RATE | FIXED PACK | | PROPOSED PACK | | BANDWIDTH SAVINGS |
|---|---|---|---|---|---|---|
| | | N | M | N | M | |
| 2500 | 0% | 3 | 0 | 6 | 0 | 7% |
| 2500 | 5% | 3 | 2 | 7 | 3 | 8% |
| 2500 | 10% | 3 | 3 | 7 | 4 | 9% |
| 2500 | 15% | 3 | 4 | 6 | 5 | 9% |
| 2500 | 20% | 3 | 5 | 7 | 7 | 9% |
| 2500 | 25% | 3 | 6 | 6 | 8 | 9% |
| 3000 | 0% | 3 | 0 | 7 | 0 | 9% |
| 3000 | 5% | 3 | 2 | 7 | 3 | 9% |
| 3000 | 10% | 3 | 3 | 7 | 4 | 10% |
| 3000 | 15% | 3 | 4 | 9 | 5 | 10% |
| 3000 | 20% | 3 | 5 | 7 | 7 | 11% |
| 3000 | 25% | 3 | 6 | 9 | 10 | 11% |
| 3500 | 0% | 4 | 0 | 7 | 0 | 6% |
| 3500 | 5% | 4 | 2 | 9 | 3 | 6% |
| 3500 | 10% | 4 | 3 | 7 | 4 | 7% |
| 3500 | 15% | 4 | 5 | 9 | 7 | 8% |
| 3500 | 20% | 4 | 6 | 9 | 8 | 8% |
| 3500 | 25% | 4 | 7 | 9 | 10 | 8% |
| 4000 | 0% | 4 | 0 | 9 | 0 | 7% |
| 4000 | 5% | 4 | 2 | 9 | 3 | 7% |
| 4000 | 10% | 4 | 3 | 9 | 5 | 7% |
| 4000 | 15% | 4 | 5 | 9 | 7 | 9% |
| 4000 | 20% | 4 | 6 | 9 | 8 | 10% |
| 4000 | 20% | 4 | 7 | 9 | 10 | 9% |

TABLE 6:
COMPARISON BETWEEN DYNAMIC PACKETIZATION
AND FIXED DATA PACKETIZATION FOR JOINT UPLINK/DOWNLINK
CONSIDERATION, ALL DOWNLINKS EQUAL WEIGHTED TO ONE
(500 BYTES FOR FIXED)

| VIDEO SIZE | LOSS RATE | FIXED PACK | | PROPOSED PACK | | BANDWIDTH SAVINGS |
|---|---|---|---|---|---|---|
| | | N | M | N | M | |
| 500 | 0% | 1 | 0 | 2 | 0 | 10% |
| 500 | 5% | 1 | 1 | 3 | 2 | 9% |
| 500 | 10% | 1 | 2 | 3 | 3 | 11% |
| 500 | 15% | 1 | 3 | 2 | 3 | 14% |
| 500 | 20% | 1 | 3 | 2 | 4 | 11% |
| 500 | 25% | 1 | 4 | 3 | 6 | 13% |
| 1000 | 0% | 2 | 0 | 3 | 0 | 4% |
| 1000 | 5% | 2 | 1 | 4 | 2 | 6% |
| 1000 | 10% | 2 | 2 | 4 | 3 | 7% |
| 1000 | 15% | 2 | 3 | 3 | 4 | 4% |
| 1000 | 20% | 2 | 4 | 4 | 6 | 5% |
| 1000 | 25% | 2 | 5 | 4 | 7 | 6% |
| 1500 | 0% | 3 | 0 | 6 | 0 | 2% |
| 1500 | 5% | 3 | 2 | 4 | 2 | 2% |
| 1500 | 10% | 3 | 3 | 6 | 4 | 3% |
| 1500 | 15% | 3 | 4 | 6 | 5 | 4% |
| 1500 | 20% | 3 | 5 | 6 | 7 | 4% |
| 1500 | 25% | 3 | 6 | 6 | 8 | 4% |
| 2000 | 0% | 4 | 0 | 6 | 0 | 2% |
| 2000 | 5% | 4 | 2 | 6 | 3 | 2% |
| 2000 | 10% | 4 | 3 | 7 | 4 | 2% |
| 2000 | 15% | 4 | 5 | 6 | 5 | 4% |
| 2000 | 20% | 4 | 6 | 7 | 7 | 4% |
| 2000 | 25% | 4 | 7 | 6 | 8 | 4% |

| VIDEO SIZE | LOSS RATE | FIXED PACK | | PROPOSED PACK | | BANDWIDTH SAVINGS |
|---|---|---|---|---|---|---|
| | | N | M | N | M | |
| 2500 | 0% | 5 | 0 | 6 | 0 | 3% |
| 2500 | 5% | 5 | 3 | 7 | 3 | 3% |
| 2500 | 10% | 5 | 4 | 7 | 4 | 4% |
| 2500 | 15% | 5 | 5 | 6 | 5 | 3% |
| 2500 | 20% | 5 | 6 | 7 | 7 | 3% |
| 2500 | 25% | 5 | 8 | 6 | 8 | 4% |
| 3000 | 0% | 6 | 0 | 7 | 0 | 0% |
| 3000 | 5% | 6 | 3 | 7 | 3 | 1% |
| 3000 | 10% | 6 | 4 | 7 | 4 | 1% |
| 3000 | 15% | 6 | 5 | 6 | 5 | 0% |
| 3000 | 20% | 6 | 7 | 7 | 7 | 1% |
| 3000 | 25% | 6 | 8 | 9 | 10 | 0% |
| 3500 | 0% | 7 | 0 | 7 | 0 | 0% |
| 3500 | 5% | 7 | 3 | 9 | 3 | 0% |
| 3500 | 10% | 7 | 4 | 7 | 4 | 0% |
| 3500 | 15% | 7 | 6 | 9 | 7 | 0% |
| 3500 | 20% | 7 | 7 | 9 | 8 | 0% |
| 3500 | 25% | 7 | 9 | 9 | 10 | 1% |
| 4000 | 0% | 8 | 0 | 9 | 0 | 1% |
| 4000 | 5% | 8 | 3 | 9 | 3 | 1% |
| 4000 | 10% | 8 | 5 | 9 | 5 | 1% |
| 4000 | 15% | 8 | 6 | 9 | 7 | 0% |
| 4000 | 20% | 8 | 8 | 9 | 8 | 2% |
| 4000 | 20% | 8 | 10 | 9 | 10 | 2% |

FIG. 12B

TABLE 7:
COMPARISON BETWEEN DYNAMIC PACKETIZATION
AND FIXED DATA PACKETIZATION FOR JOINT UPLINK/DOWNLINK
CONSIDERATION WITH DOWNLINKS STATISTICALLY WEIGHTED
(1000 BYTES FOR FIXED)

| VIDEO SIZE | LOSS RATE | FIXED PACK N | FIXED PACK M | PROPOSED PACK N | PROPOSED PACK M | BANDWIDTH SAVINGS |
|---|---|---|---|---|---|---|
| 500 | 0% | 1 | 0 | 1 | 0 | 0% |
| 500 | 5% | 1 | 1 | 1 | 1 | 0% |
| 500 | 10% | 1 | 2 | 3 | 3 | 4% |
| 500 | 15% | 1 | 3 | 2 | 3 | 18% |
| 500 | 20% | 1 | 3 | 2 | 4 | 8% |
| 500 | 25% | 1 | 4 | 3 | 6 | 13% |
| 1000 | 0% | 1 | 0 | 1 | 0 | 0% |
| 1000 | 5% | 1 | 1 | 4 | 2 | 4% |
| 1000 | 10% | 1 | 2 | 4 | 3 | 17% |
| 1000 | 15% | 1 | 3 | 2 | 3 | 23% |
| 1000 | 20% | 1 | 3 | 5 | 6 | 16% |
| 1000 | 25% | 1 | 4 | 4 | 7 | 23% |
| 1500 | 0% | 2 | 0 | 3 | 0 | 0% |
| 1500 | 5% | 2 | 2 | 4 | 2 | 11% |
| 1500 | 10% | 2 | 3 | 4 | 3 | 15% |
| 1500 | 15% | 2 | 3 | 6 | 5 | 5% |
| 1500 | 20% | 2 | 4 | 5 | 6 | 9% |
| 1500 | 25% | 2 | 5 | 6 | 8 | 12% |
| 2000 | 0% | 2 | 0 | 3 | 0 | 1% |
| 2000 | 5% | 2 | 2 | 4 | 2 | 13% |
| 2000 | 10% | 2 | 3 | 4 | 3 | 17% |
| 2000 | 15% | 2 | 3 | 6 | 5 | 9% |
| 2000 | 20% | 2 | 4 | 7 | 7 | 12% |
| 2000 | 25% | 2 | 5 | 6 | 8 | 15% |

| VIDEO SIZE | LOSS RATE | FIXED PACK | | PROPOSED PACK | | BANDWIDTH SAVINGS |
|---|---|---|---|---|---|---|
| | | N | M | N | M | |
| 2500 | 0% | 3 | 0 | 3 | 0 | 0% |
| 2500 | 5% | 3 | 2 | 4 | 2 | 5% |
| 2500 | 10% | 3 | 3 | 4 | 3 | 6% |
| 2500 | 15% | 3 | 4 | 6 | 5 | 8% |
| 2500 | 20% | 3 | 5 | 7 | 7 | 9% |
| 2500 | 25% | 3 | 6 | 6 | 8 | 9% |
| 3000 | 0% | 3 | 0 | 4 | 0 | 0% |
| 3000 | 5% | 3 | 2 | 4 | 2 | 5% |
| 3000 | 10% | 3 | 3 | 7 | 4 | 7% |
| 3000 | 15% | 3 | 4 | 6 | 5 | 9% |
| 3000 | 20% | 3 | 5 | 7 | 7 | 10% |
| 3000 | 25% | 3 | 6 | 6 | 8 | 10% |
| 3500 | 0% | 4 | 0 | 4 | 0 | 0% |
| 3500 | 5% | 4 | 2 | 4 | 2 | 0% |
| 3500 | 10% | 4 | 3 | 7 | 4 | 1% |
| 3500 | 15% | 4 | 5 | 6 | 5 | 8% |
| 3500 | 20% | 4 | 6 | 7 | 7 | 9% |
| 3500 | 25% | 4 | 7 | 9 | 10 | 8% |
| 4000 | 0% | 4 | 0 | 4 | 0 | 0% |
| 4000 | 5% | 4 | 2 | 4 | 2 | 0% |
| 4000 | 10% | 4 | 3 | 7 | 4 | 2% |
| 4000 | 15% | 4 | 5 | 6 | 5 | 9% |
| 4000 | 20% | 4 | 6 | 9 | 8 | 10% |
| 4000 | 20% | 4 | 7 | 9 | 10 | 9% |

TABLE 8:
COMPARISON BETWEEN DYNAMIC PACKETIZATION
AND FIXED DATA PACKETIZATION FOR JOINT UPLINK/DOWNLINK
CONSIDERATION WITH ALL DOWNLINKS STATISTICALLY WEIGHTED
(500 BYTES FOR FIXED)

| VIDEO SIZE | LOSS RATE | FIXED PACK | | PROPOSED PACK | | BANDWIDTH SAVINGS |
|---|---|---|---|---|---|---|
| | | N | M | N | M | |
| 500 | 0% | 1 | 0 | 1 | 0 | 0% |
| 500 | 5% | 1 | 1 | 1 | 1 | 0% |
| 500 | 10% | 1 | 2 | 3 | 3 | 4% |
| 500 | 15% | 1 | 3 | 2 | 3 | 18% |
| 500 | 20% | 1 | 3 | 2 | 4 | 8% |
| 500 | 25% | 1 | 4 | 3 | 6 | 13% |
| 1000 | 0% | 2 | 0 | 1 | 0 | 2% |
| 1000 | 5% | 2 | 2 | 4 | 2 | 7% |
| 1000 | 10% | 2 | 3 | 4 | 3 | 11% |
| 1000 | 15% | 2 | 3 | 2 | 3 | 0% |
| 1000 | 20% | 2 | 4 | 5 | 6 | 3% |
| 1000 | 25% | 2 | 5 | 4 | 7 | 6% |
| 1500 | 0% | 3 | 0 | 3 | 0 | 0% |
| 1500 | 5% | 3 | 2 | 4 | 2 | 3% |
| 1500 | 10% | 3 | 3 | 4 | 3 | 4% |
| 1500 | 15% | 3 | 4 | 6 | 5 | 3% |
| 1500 | 20% | 3 | 5 | 5 | 6 | 4% |
| 1500 | 25% | 3 | 6 | 6 | 8 | 4% |
| 2000 | 0% | 4 | 0 | 3 | 0 | 1% |
| 2000 | 5% | 4 | 2 | 4 | 2 | 0% |
| 2000 | 10% | 4 | 3 | 4 | 3 | 0% |
| 2000 | 15% | 4 | 5 | 6 | 5 | 6% |
| 2000 | 20% | 4 | 6 | 7 | 7 | 4% |
| 2000 | 25% | 4 | 7 | 6 | 8 | 4% |

FIG. 14A

| VIDEO SIZE | LOSS RATE | FIXED PACK | | PROPOSED PACK | | BANDWIDTH SAVINGS |
|---|---|---|---|---|---|---|
| | | N | M | N | M | |
| 2500 | 0% | 5 | 0 | 3 | 0 | 4% |
| 2500 | 5% | 5 | 3 | 4 | 2 | 7% |
| 2500 | 10% | 5 | 4 | 4 | 3 | 5% |
| 2500 | 15% | 5 | 5 | 6 | 5 | 3% |
| 2500 | 20% | 5 | 6 | 7 | 7 | 2% |
| 2500 | 25% | 5 | 8 | 6 | 8 | 5% |
| 3000 | 0% | 6 | 0 | 4 | 0 | 4% |
| 3000 | 5% | 6 | 3 | 4 | 2 | 4% |
| 3000 | 10% | 6 | 4 | 7 | 4 | 1% |
| 3000 | 15% | 6 | 5 | 6 | 5 | 0% |
| 3000 | 20% | 6 | 7 | 7 | 7 | 3% |
| 3000 | 25% | 6 | 8 | 6 | 8 | 0% |
| 3500 | 0% | 7 | 0 | 4 | 0 | 4% |
| 3500 | 5% | 7 | 3 | 4 | 2 | 2% |
| 3500 | 10% | 7 | 4 | 7 | 4 | 0% |
| 3500 | 15% | 7 | 6 | 6 | 5 | 2% |
| 3500 | 20% | 7 | 7 | 7 | 7 | 0% |
| 3500 | 25% | 7 | 9 | 9 | 10 | 1% |
| 4000 | 0% | 8 | 0 | 4 | 0 | 5% |
| 4000 | 5% | 8 | 3 | 4 | 2 | 1% |
| 4000 | 10% | 8 | 5 | 7 | 4 | 3% |
| 4000 | 15% | 8 | 6 | 6 | 5 | 0% |
| 4000 | 20% | 8 | 8 | 9 | 8 | 2% |
| 4000 | 20% | 8 | 10 | 9 | 10 | 2% |

FIG. 14B

JOINT OPTIMIZATION OF PACKETIZATION AND ERROR CORRECTION FOR VIDEO COMMUNICATION

TECHNICAL FIELD

The present disclosure relates generally to video communication, and, more particularly, to error correction for video communication.

BACKGROUND

Real-time video communication applications over an Internet Protocol (IP) network, such as online video conferencing and video chatting, are becoming widely deployed nowadays in both enterprise and consumer markets, and will become more and more popular in the foreseeable future. In those applications, the compressed video bitstreams are generally packetized into packets that are smaller than a Maximum Data Unit (MDU) of the underlying IP networks. Packetization schemes are defined under different transportation protocols such as the well-known Real Time Protocol (RTP). To combat the packet losses over the network, Forward Error Correction (FEC) schemes are often applied across the video data packets. The generated error correction packets help to recover the lost video data packets if the number of the lost packets is smaller than the correction capability of the FEC code applied.

For low-delay video communications, only video data that is within a very short period of time, usually data belonging to the same video frame, can be combined into one block of source packets for FEC. The number of video source packets in such cases is usually fairly small, especially for packets of Standard Definition (SD) video resolution and below, and the FEC code correspondingly applied to those video source packets is usually a set of shorter codes (truncated from longer codes). The FEC codes are a large overhead cost, in terms of bandwidth and processing, especially where the number of video source packets is small. Notably, also, the behavior of such shorter FEC codes can vary greatly for different packet loss rates on the communication channel.

BRIEF DESCRIPTION OF THE DRAWINGS

The embodiments herein may be better understood by referring to the following description in conjunction with the accompanying drawings in which like reference numerals indicate identically or functionally similar elements, of which:

FIG. 7 illustrates an example table of a performance comparison between shorter code and longer code.

FIG. 8 illustrates an example table of an FEC design based on fixed data packetization;

FIGS. 9A-B illustrate an example table of a comparison between dynamic packetization and fixed data packetization (1000 bytes for fixed);

FIGS. 10A-B illustrate an example table of a comparison between dynamic packetization and fixed data packetization (500 bytes for fixed);

FIGS. 11A-B illustrate an example table of a comparison between dynamic packetization and fixed data packetization for joint uplink/downlink consideration, all downlinks equal weighted to one (1000 bytes for fixed);

FIGS. 12A-B illustrate an example table of a comparison between dynamic packetization and fixed data packetization for joint uplink/downlink consideration, all downlinks equal weighted to one (500 bytes for fixed);

FIGS. 13A-B illustrate an example table of a comparison between dynamic packetization and fixed data packetization for joint uplink/downlink consideration with downlinks statistically weighted (1000 bytes for fixed);

FIGS. 14A-B illustrate an example table of a comparison between dynamic packetization and fixed data packetization for joint uplink/downlink consideration with downlinks statistically weighted (500 bytes for fixed)

DESCRIPTION OF EXAMPLE EMBODIMENTS

Overview

According to one or more embodiments of the disclosure, a process determines a size of a video unit (e.g., frame) to transmit from a sender to a receiver across a communication channel for an associated video stream, and also determines an updated packet loss rate on the channel. In response, the process may dynamically determine both a number N of video data packets and a number M of forward error correction (FEC) packets to transmit for the video unit based on the size of the video unit, the updated packet loss rate on the channel, and an error resilience requirement for the video stream. In an illustrative embodiment, N and M are determined during transmission of the video stream through a look-up operation into a table indexed by the size of the video unit and the updated packet loss rate as co-indices, the co-indices co-indexing a pre-determined N and M pair.

Description

Figure 1:
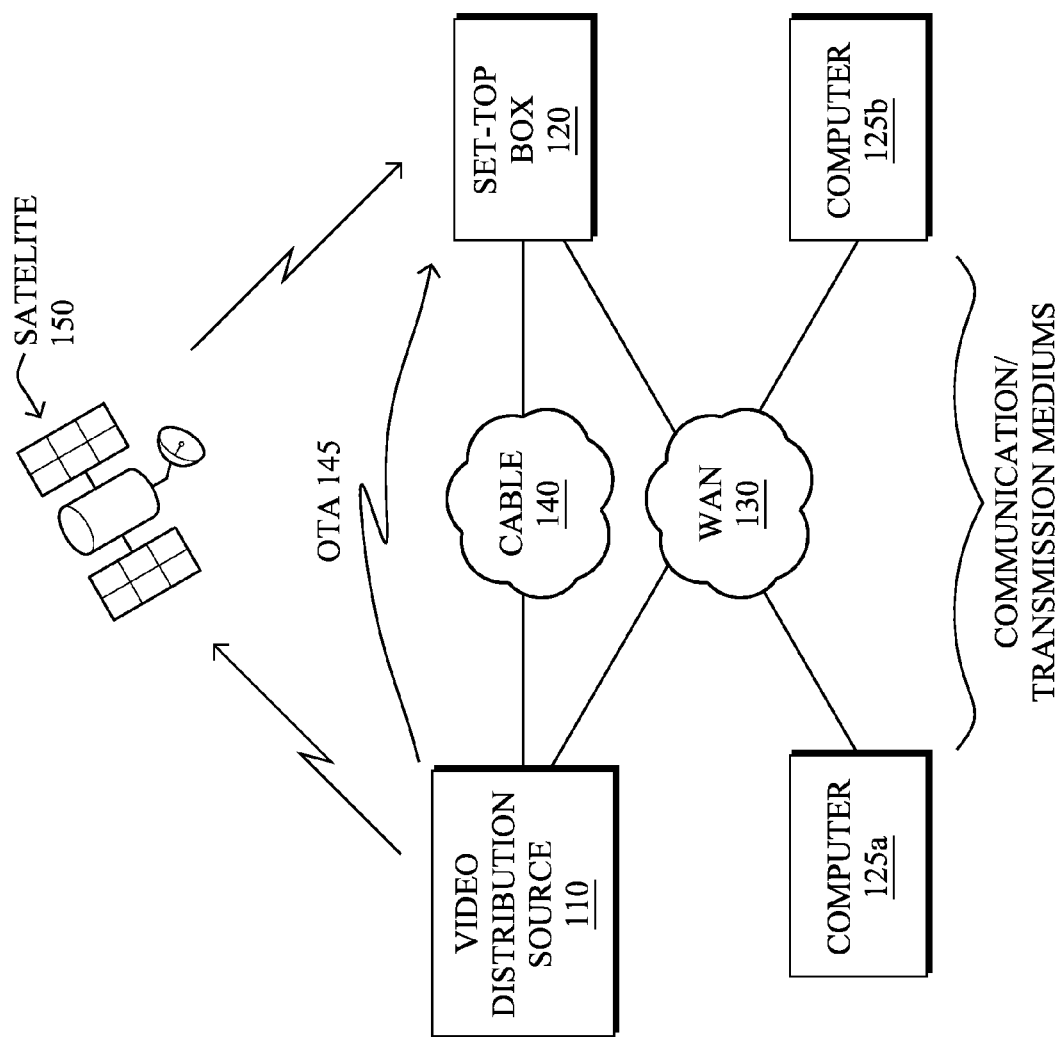
FIG. 1 illustrates an example video communication network.

FIG. 1 is a schematic block diagram of an example communication network 100 illustratively comprising nodes/devices, such as a video distribution source 110 configured to distribute video to one or more set-top boxes (STBs) 120 and/or one or more computers 125 (e.g., 125a and 125b). For instance, video may be distributed by source 110 in any number of available mediums, such as video-over-IP (Internet Protocol) via wide area network (WAN) 130, through a cable network 140, over-the-air (OTA) transmissions 145, or satellite transmission 150, etc. Also, in certain embodiments, a computer (e.g., personal computer or "PC") may distribute video over WAN 130 to other receiving devices, as will be appreciated by those skilled in the art. For example, two or more computers may participate in a video sharing application (video chat, online conferencing, etc.). Those skilled in the art will understand that any number of nodes, devices, links, etc. may be used in the communication network 100, and that the view shown herein is for simplicity.

Note that a set-top box 120 may consist of a converter box (e.g., a universal media server or "UMS") used by air (antenna), video digital subscriber line (DSL), IP, cable, and/or satellite service providers to convert proprietary signals (from video distribution source 110) into audio and/or video (A/V) outputs for STB users, e.g., images for a television and/or monitor. Similarly, a computer 125 may also be configured to convert such signals into A/V streams for display on an associated monitor (primarily these are DSL or IP signals, though other signals may also be converted provided proper equipment and configuration).

Figure 2A:
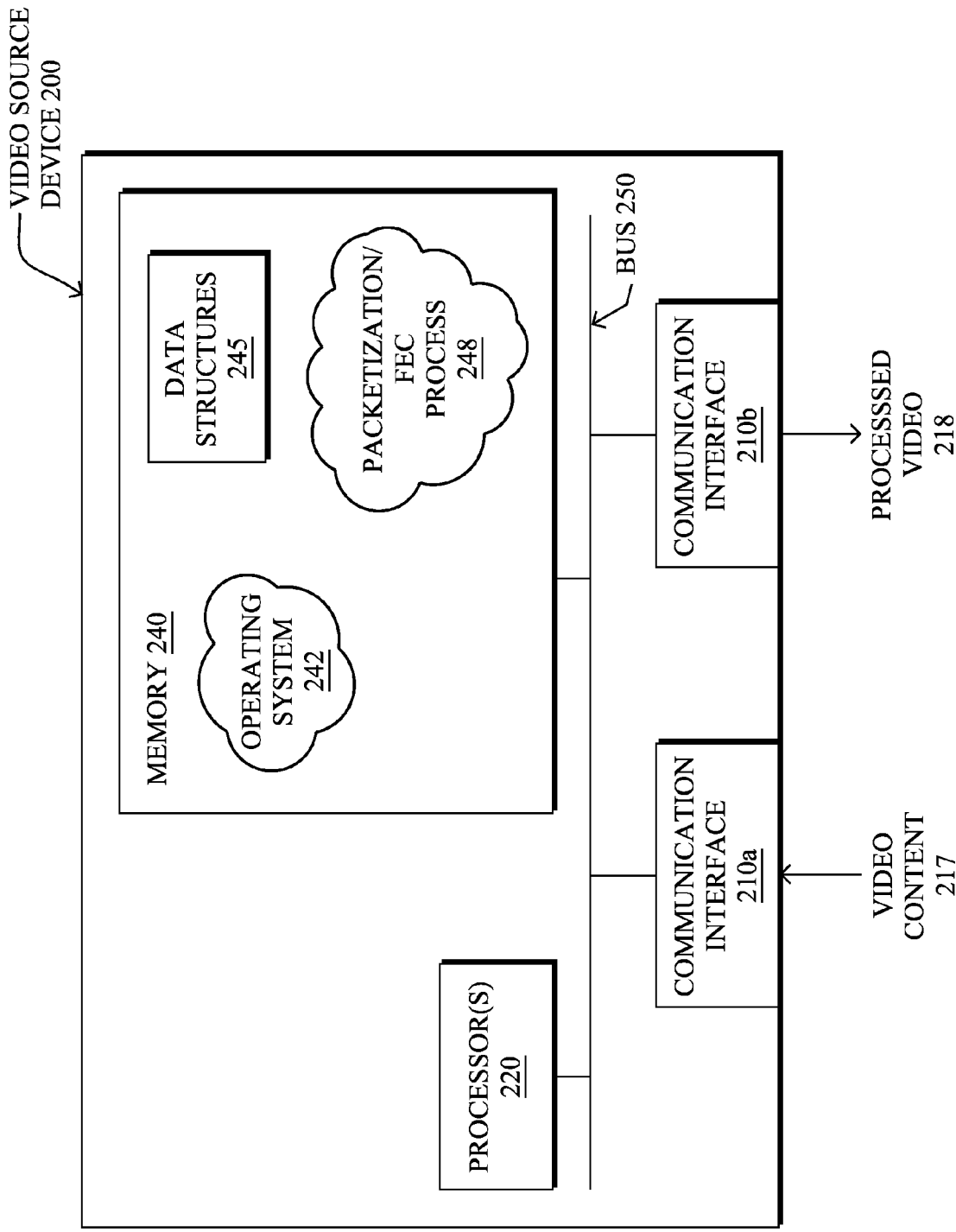
FIGS. 2A-2B illustrate an example device/node and video coder.

FIG. 2A is a schematic block diagram of an example node/device 200 that may be used with one or more embodiments described herein, e.g., as any node/device in FIG. 1 capable of encoding video as described herein, such as the video distribution source 110 and/or computers 125. The device may comprise one or more communication interfaces 210, at least one processor 220, and a memory 240 interconnected by a system bus 250.

The communication interface(s) 210 contain the mechanical, electrical, and signaling circuitry for communicating data (e.g., video) over various transmission mediums of the network 100. For instance, the interfaces may be configured to transmit and/or receive data using a variety of different communication protocols suitable for the transmission mediums as noted above and as will be understood by those skilled in the art. Note, further, that the device may have an input interface 210*a* and an output interface 210*b*, or else a single interface may be used for both input and output communication.

The memory 240 comprises a plurality of storage locations that are addressable by the processor 220 for storing software programs and data structures associated with the embodiments described herein. The processor 220 may comprise necessary elements or logic adapted to execute the software programs and manipulate the data structures 245 (e.g., tables, values, etc.). An operating system 242, portions of which are typically resident in memory 240 and executed by the processor, functionally organizes the device by, inter alia, invoking operations in support of software processes and/or services executing on the device. These software processes and/or services may comprise an illustrative packetization/FEC (forward error correction) process 248 for use as described herein.

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process). Further, while the processes may have been shown separately or in combination, those skilled in the art will appreciate that processes may be routines or modules within other processes, or else standalone processes, accordingly.

Figure 2B:

In addition, FIG. 2B illustrates an alternative view of the device 200, in which the device is modeled simply as a process/module. That is, a packetization/FEC encoder 248 may receive compressed video content 217 (i.e., at an input configured to receive compressed video content, such as from a video source encoder), and output packetized video (packetized frames, regions, etc.) 218, according to the techniques described herein.

Illustratively, certain techniques described herein may be performed by hardware, software, and/or firmware, such as in accordance with packetization/FEC encoder (process) 248, which may contain computer executable instructions executed by the processor 220 to perform functions relating to the novel techniques described herein, such as within a video distribution source 110, computer 125, etc. For example, the techniques herein may be treated as extensions/improvements to conventional protocols, such as packetization and/or FEC protocols, and as such, would be processed by similar components understood in the art that execute such protocols, accordingly.

As mentioned above, real-time video communication applications over an Internet Protocol (IP) network, such as online video conferencing and video chatting, are becoming widely deployed nowadays in both enterprise and consumer markets, and will become more and more popular in the foreseeable future. In those applications, the compressed video bitstreams are generally packetized into packets that are smaller than a Maximum Data Unit (MDU) of the underlying IP networks. Also, to combat the packet losses over the network, Forward Error Correction (FEC) schemes are often applied across the video data packets. The generated error correction packets help to recover the lost video data packets if the number of the lost packets is smaller than the correction capability of the FEC code applied.

Figure 3:
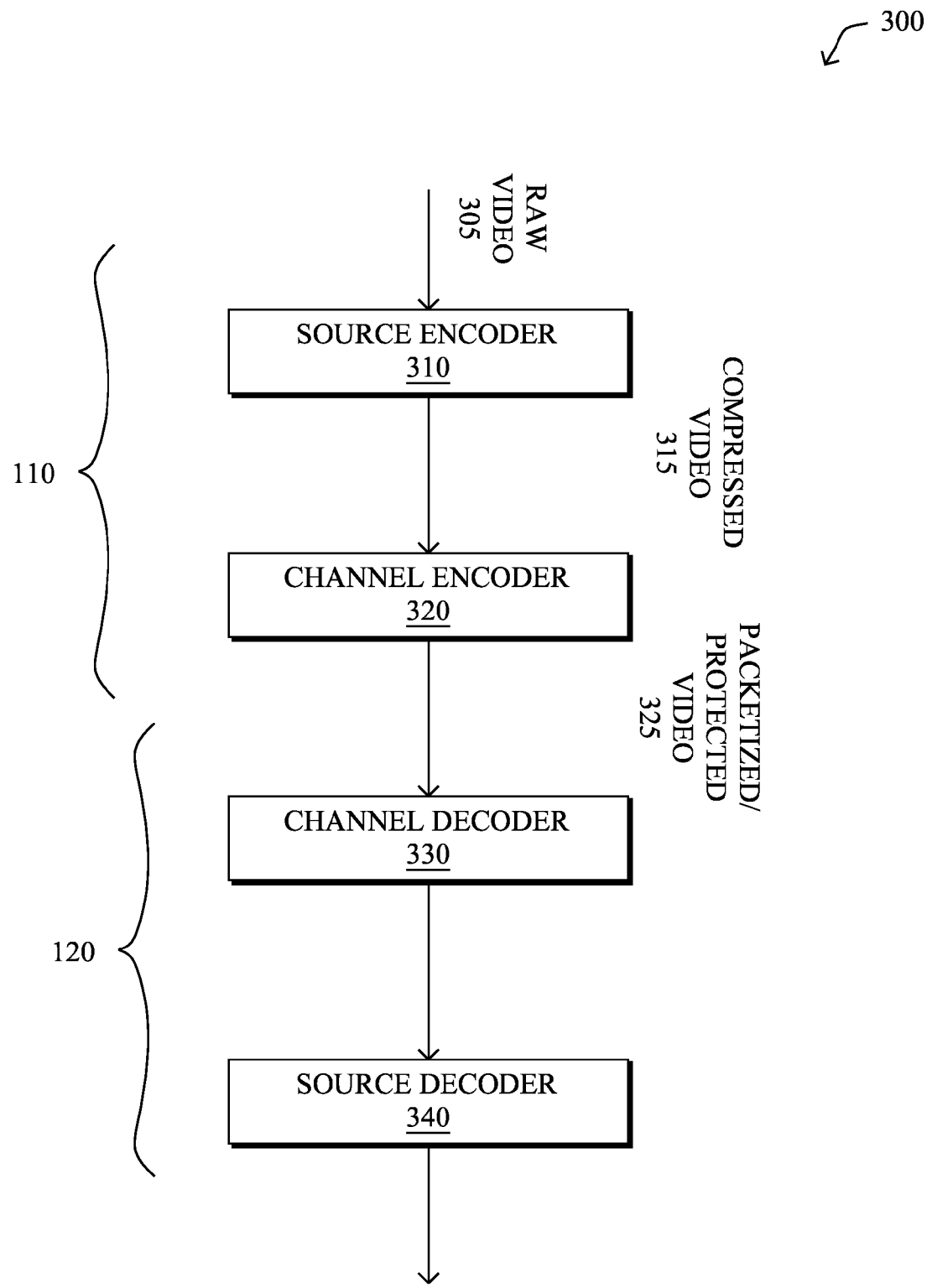
FIG. 3 illustrates an example baseline procedure of video communication.

FIG. 3 illustrates an example flow of video as it is converted from input to output video. Specifically, at a video source 110, raw video 305 may enter a source encoder 310, which processes the raw video data into compressed video data 315 (e.g., 217 of FIG. 2), or bitstream. Those skilled in the art will understand that the source encoder 310 may perform such functionality as transformation, quantization, binary encoding, etc. The compressed video data 315 is then received by a channel encoder 320 (e.g., 248 of FIG. 2), in which the packetization and FEC processing takes place. That is, the channel encoder processes the compressed video data directly, and often adds protection to the compressed video data in addition to packetization, such that an input video unit that is already in the compressed domain is processed into an output 325 (e.g., 218 of FIG. 2) that is the video packets with additional protection packets, in a manner as described herein. Once the packetized video is received by the receiver 120 (e.g., set-top box), the channel decoder 330 decodes the packetized video, and forwards it to a source decoder 340 to produce the output video, accordingly.

During the channel coding at encoder 320, FEC processing takes a number "N" of incoming source video packets and mathematically generates an additional set of "M" FEC coding packets to assist in error recovery in the event one or more of the N packets are lost during transmission. That is, as will be understood by those skilled in the art, FEC provides additional M coded packets such that as long as you can receive a certain number (e.g., N) of the N and M packets, then the data (e.g., a video frame) can be recovered.

As noted above, for low-delay video communications, only video data that is within a very short period of time, usually data belonging to the same video frame, can be combined into one block of source packets for FEC. The number of video source packets in such cases is usually fairly small, especially for packets of Standard Definition (SD) video resolution and below, and the FEC code correspondingly applied to those video source packets is usually a set of shorter codes (truncated from longer codes). The FEC codes (M packets) are a large overhead cost, in terms of bandwidth and processing, especially where the number of video source packets (N packets) is small. Notably, also, the behavior of such shorter FEC codes can vary greatly for different packet loss rates on the communication channel.

Therefore, for such low-delay video communication, it becomes critical to choose the best FEC code under a given packet loss rate while minimizing the overall bandwidth overhead.

"Adaptive FEC" for video communication is a widely discussed technical topic, and includes such techniques as Unequal Error Protection (UEP), the adaptation of the FEC code, or even the joint optimization of source coding and the FEC channel coding. However, none has focused on the particular problem that the low delay and short code introduced, and none has tackled the problem from the view of joint optimization of data packetization and FEC code selection.

The description herein presents an algorithm for joint optimization of the source video data packetization and FEC code selection in video communication applications, such as low-delay video. In particular, under a given packet loss rate, the techniques herein select the best FEC code to achieve the error-resilience design goal while minimizing the associated overhead, and also minimizing the overall network bandwidth requirement by dynamic source data packetization.

Specifically, according to one or more embodiments of the disclosure as described in greater detail below, a process determines a size of a video unit (e.g., frame) to transmit from a sender to a receiver across a communication channel for an associated video stream, and also derives an updated packet loss rate on the channel. In response, the process may dynamically determine both a number N of video data packets and a number M of FEC packets to transmit for the video unit based on the size of the video unit, the updated packet loss rate on the channel, and an error resilience requirement for the video stream. In an illustrative embodiment, N and M are determined during transmission of the video stream through a look-up operation into a table indexed by the size of the video unit and the updated packet loss rate as co-indices, the co-indices co-indexing a pre-determined N and M pair. Additional aspects and features are also described below that may provide further enhancements to the dynamic packetization and FEC techniques of the embodiments herein.

Operationally, the techniques herein jointly optimize the source data packetization and FEC code for a given packet loss rate, and can be applied to several use cases for low-delay video communication applications.

Use Case Scenarios

Figure 4:
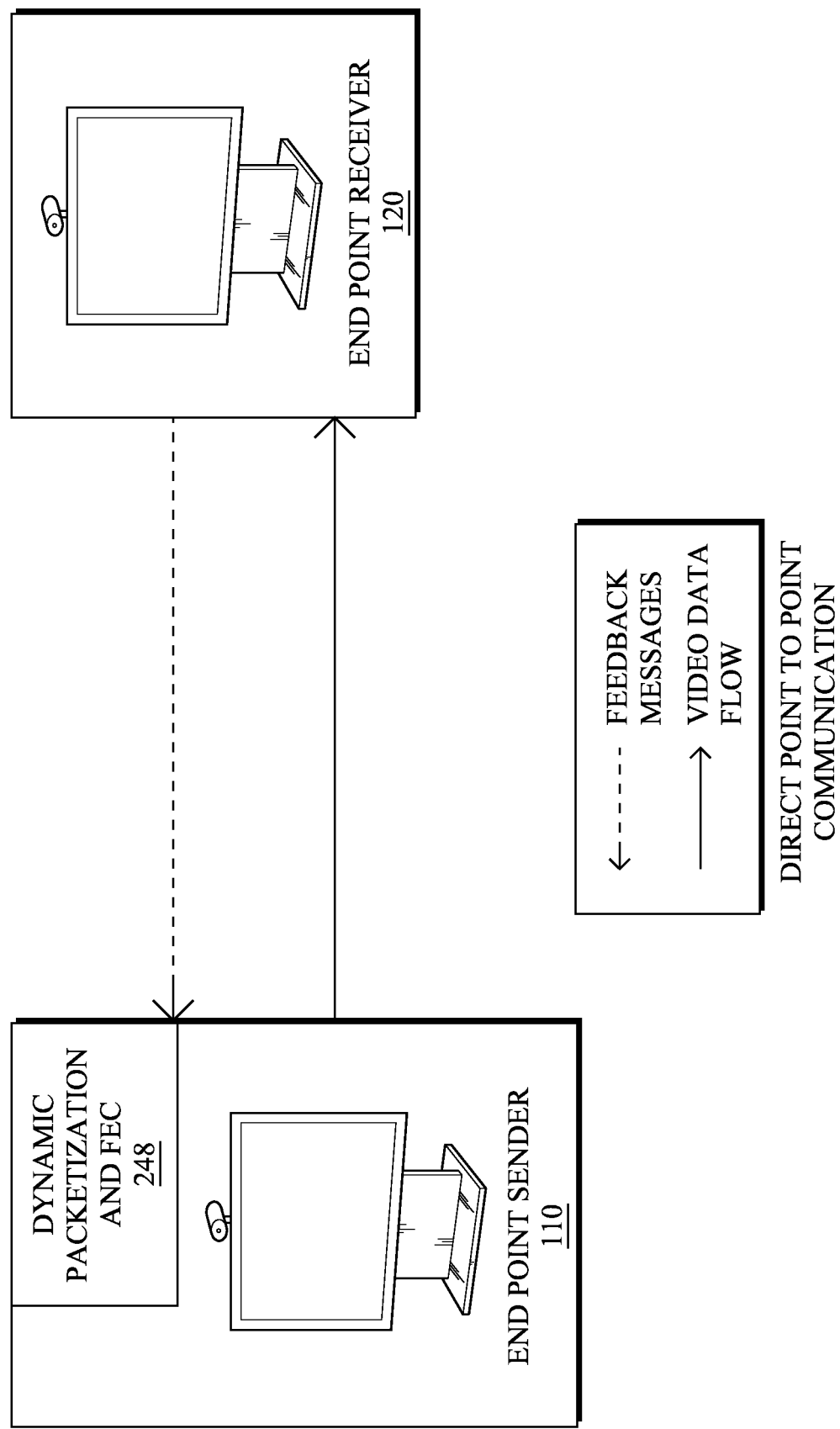
FIG. 4 illustrates an example of direct point-to-point communication.

In a first use case, as shown in FIG. 4, the video is transmitted directly (e.g., point-to-point) between two clients, sender 110 and receiver 120. The packet loss rate of the communication channel may be derived from a feedback message sent from the receiver to the sender periodically. As described herein, for each group of source packets, usually the packets belonging to the same video frame for low-delay purpose, the sender calculates the optimal packetization scheme and FEC code to be used jointly, and sends both the source data packets and error correction packets to the receiver. The overall bandwidth usage is minimized on this peer-to-peer connection while an error-resilience design goal is achieved.

Figure 5:
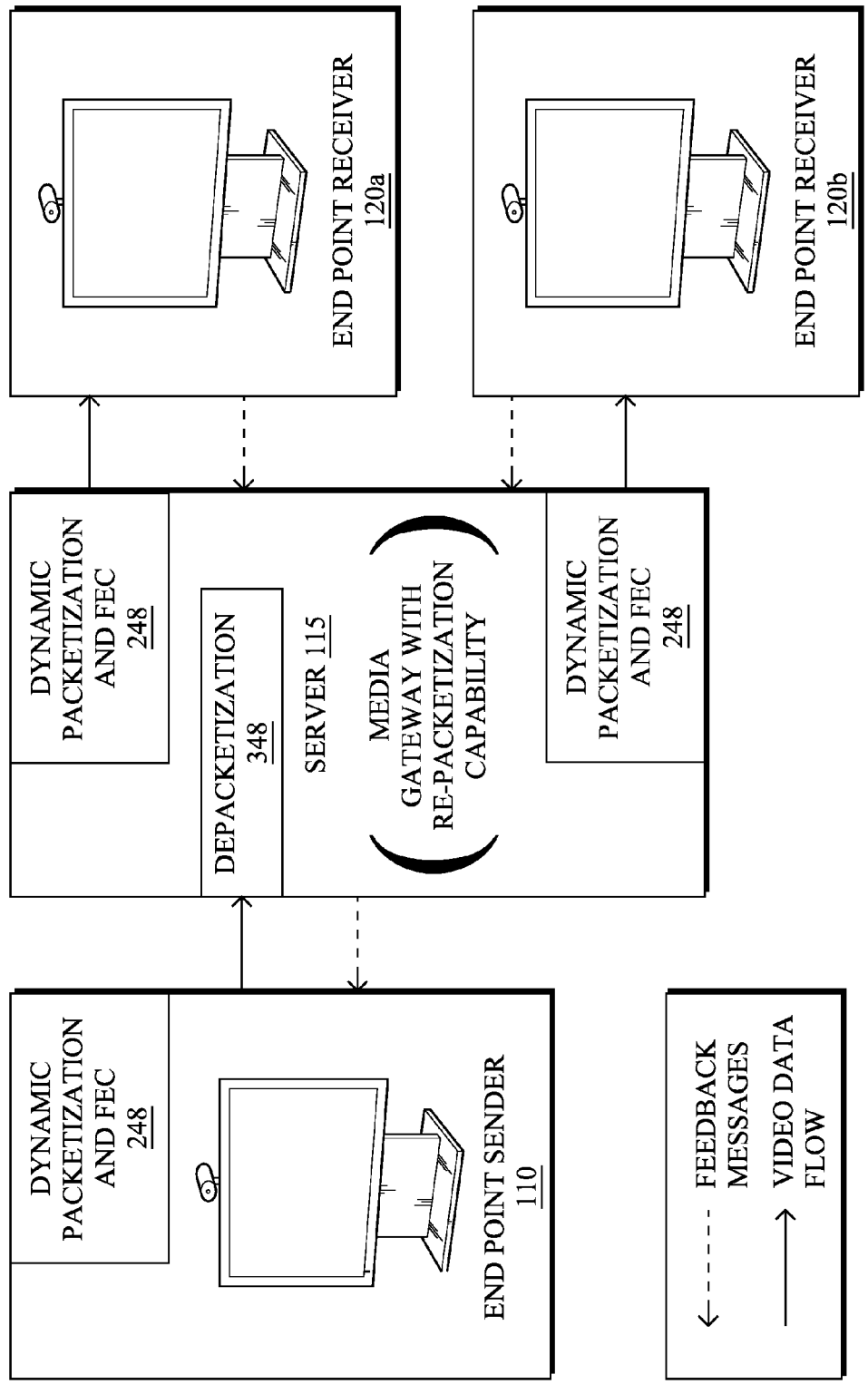
FIG. 5 illustrates an example of a multipoint connection topology.

In a second use case, as shown in FIG. 5, the video is transmitted in a multipoint connection topology. There is a server 115 or media gateway in between the sender 110 and receivers 120a and 120b. The sender sends out the video to the server on an uplink, while the server sends out video to each receiver through each individual downlink. The network condition in the uplink and downlinks might be different. If the server has the capability and resource to do re-packetization and re-FEC, the sender only needs to consider the network condition of the uplink when optimizing the packetization and FEC code and minimizing the uplink overhead. As described herein, the server will then do the optimization for each downlink according to their corresponding network condition and minimize the overhead for each downlink. In particular, upon receiving the video stream on an uplink channel from an original sender, a repacketizing server 115 independently repacketizes the video stream per each downlink channel to corresponding end-point receivers. Specifically, as described below, the repacketizing is based on dynamically determining an additional number N of video data packets and an additional corresponding number M of FEC packets to transmit for the video unit based additionally on a corresponding updated packet loss rate on each respective downlink channel. For instance, the receivers could be on different types of networks, e.g., with different loss rates, and as such, different repacketization and FEC schemes may be selected.

Figure 6:
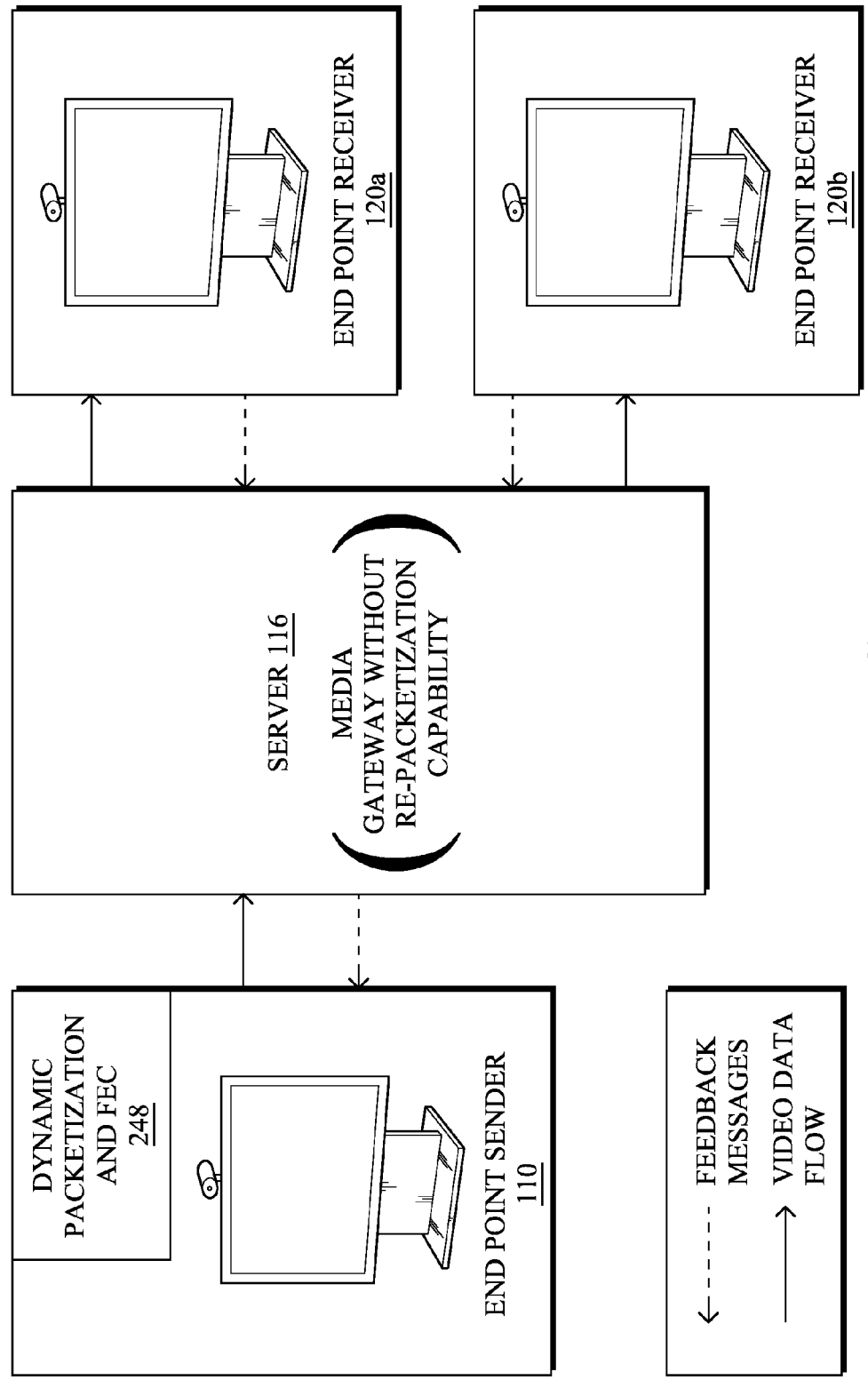
FIG. 6 illustrates an example connection topology as in FIG. 5 with a non-repacketizing server.
Figure 9B:
Figure 11B:
Figure 13B:

In the third use case, as shown in FIG. 6, the connection topology is same as in FIG. 5, however, the server 116 or gateway here does not have the capability to do re-packetization/re-FEC ("non-repacketizing server" 116). The sender 110 therefore needs to consider the network conditions of all links and optimizes the packetization/FEC to minimize the overall bandwidth overhead which considers all the links. Said differently, and as described further below, when there is a non-repacketizing server, the sender 110 determines N and M for an uplink channel between the sender and non-repacketizing server (an initial "receiver" of the packets), and the non-repacketizing server determines its own number M of FEC packets to transmit for the video unit based on the size of the video unit, the number N determined by the sender, the updated packet loss rate on a particular downlink channel from the non-repacketizing server to a particular end-point receiver, and the error resilience requirement for the video stream. Illustratively, the sender 110 may determine N such that an overall data size associated with transmitting a corresponding video unit is minimized for transmission from the sender to the non-repacketizing server, and from the non-repacketizing server to each of the one or more end-point receivers.

Mathematically, both the first case and second case deal with the single channel processing, where in the second case the server 115 in between performs the calculation (again) for the downlink channels. The third case deals with processing for multiple channels. Once each of the solutions are derived, whether for single channel or multiple channels, the sender(s) transmit the determined N video data packets and M FEC packets for the video unit to the receiver(s) across the communication channel, accordingly. Note that for single channel use, as described herein, a fast lookup operation into a pre-configured table may be used, while in the multiple channel use, such a table may be generated dynamically (e.g., "on the fly"), since there are many different options to consider with multi-channel usage.

Packet Erasure Code and Its Failure Rate

Assume that a packet loss probability is $\rho_p$ (for simplification, $\rho_p$ is assumed to be i.i.d, independent and identically-distributed). One video frame is encoded and composed with N data packets. Then, as noted above, M FEC packets are applied to those N data packets. The frame is thought to be lost if less than N of the total M+N packets are received. The loss probability of the frame $\rho_f$ can be derived as:

$$\rho_f = \sum_{k=0}^{N-1} [C_{N+M}^k \rho_p^{M+N-k} * (1-\rho_p)^k] \qquad \text{Equation 1}$$

where "C" is the mathematical representation of the various permutations and combinations, as will be appreciated by those skilled in the art.

This loss probability of the frame can be seen as the failure rate for this ((N+M), N) erasure code. As can be seen in Table 1 of FIG. 7, for example, given the same overhead ratio, the shorter block code often has worse failure rate than the longer block code. Also note that the failure rate is not necessarily monotonically decreased with the increased block code size for all the cases.

Error Resilience Design Criterion

For adaptive FEC design, the criterion (error resilience requirement) needs to be defined so that the "best" FEC code has its useful meaning. Illustratively, a key frame request interval may be used as an example. A key frame is usually an intra-coded frame which can stop video artifacts due to loss and error propagation in the video bitstream, as may be appreciated by those skilled in the art. The associated video application can define when the receiver requests a key frame. In one example embodiment, the video application uses Scalable Video Coding (SVC), and the key frame request only happens when the base temporal layer gets lost. By using this arrangement as an example, it can show how the error resilience design criterion affects the selection of the FEC code. Note that this is only an example, and other criterion can be applied too. The final derivation should be the maximum loss probability of the frame $\rho_f$ than can be allowed.

Assume the design criterion is to satisfy the average key frame request interval $$T_1 > \tau \qquad \text{Equation 2}$$

Denote the frame rate of the base temporal layer as Fr. The above requirement will be translated into the threshold in the frame loss probability through the following derivations.

Denote $E_f$ as average (expect value) loss interval in number of frames:

$$E_f = 1/\rho_f \qquad \text{Equation 3}$$

Denote $E_t$ as average (expect value) loss interval in number of seconds:

$$E_t = E_f/FR = 1/(\rho_f \times FR) \qquad \text{Equation 4}$$

In this case, the key frame request interval is equal to the average key frame loss interval:

$$T_1 = E_t \qquad \text{Equation 5}$$

Therefore, the original requirement can be translated into the frame loss probability:

$$\rho_f < 1/(\tau \times Fr) \qquad \text{Equation 6}$$

Using one example of τ=60 seconds and Fr=6 fps, the resultant, and entirely illustrative criterion is $\rho_f$<0.2778% (which is purely an example and not meant to limit the scope of the embodiments herein).

Adaptive FEC Design Under Fixed Data Packetization

In Table 2 of FIG. 8, it is shown that for the given packet loss rate $\rho_p$ and the given number of data packets N, there is a minimal M that can achieve such requirement. Note that only some typical loss rates and packet numbers are shown here. The bandwidth overhead used on FEC is also approximated as the ratio between M and N (the packet header is not considered).

It can be clearly seen from Table 2 that to satisfy the design requirement under the is same packet loss rate, the FEC overhead is quite different for the different (N+M, M) pairs. Picking one example, for 10% packet loss rate, (2+3,3) code can have 150% overhead, while (4+3,4) code only has 75% overhead. This leads to the idea of optimizing the pair to minimize the overall overhead. Note that the overall overhead should also include all the packets headers, which is ignored in Table 2 for simplicity of discussion. Also note that for a given video frame, the final N data packets generated should be of equal length, to reduce the overhead caused by the FEC packets.

Problem Definition:

Denote the size of the current video unit (e.g., frame) as data $L_{data}$, the size of all the headers in one IP packet as $L_{pack\_header}$, the minimal data size within one data packet as $L_{min\_pack\_data}$, and the maximal data size within one data packet as $L_{max\_pack\_data}$. For the given network packet loss rate $\rho_p$, find the data packetization scheme to generate N data packets (with length of $L_{pack\_data}$=ceil ($L_{data}$/N) each) and M FEC packets (same size as the data packet), such that the error resilience requirement is satisfied and the overall data size (which translates to bandwidth) $L_{overall}$=(N+M)× ($L_{pack\_header}$+$L_{pack\_data}$) is minimized.

Derivation of the Optimal Design for the Single Channel

Illustratively, N and M can be determined during transmission of a video stream through a look-up operation into a table indexed by the size of the video unit and the updated packet loss rate as co-indices, where the co-indices co-index a predetermined N and M pair. The following steps may be taken to derive/generate the optimal two-dimensional table (e.g., a data structure 245) offline:

For all packet loss rates considered, calculate the frame loss rate of all the ((N+M), M) pairs that can be implemented for each updated packet loss rate indexed into the table;

Given the design criteria, find the minimal M for each N that can satisfy the error resilience requirement. All of these may be used to build up a table of usable ((N+M), M) pairs;

For all source video unit data sizes considered (quantized to a particular size/range used as a co-index into the table), for each packet loss rate, search within the table of usable ((N+M), M) pairs to find one ((N+M), M) pair that minimizes the overall data size $L_{overall}$; and Build up a table with entries of $[L_{data}][\rho_p]$ and corresponding outputs of (N,M). In other words, populate each entry of the table, co-indexed by the size of the video unit and the updated packet loss rate, with values for N and M by a selected ((N+M), M) pair from the usable ((N+M), M) pairs that minimizes an overall data size associated with transmitting a corresponding video unit.

For online operation (during transmission of the video stream), the sender learns the size of each video frame $L_{data}$, quantized to the corresponding size in the table. Then for the given loss rate $\rho_p$, the sender simply searches the two dimensional table using entry $[L_{data}][\rho_p]$ and gets the corresponding optimal pair of (N,M) for data packetization and FEC code. Note that the given loss rate $\rho_p$ may be updated based on feedback from the receiver as noted above, or through other techniques the may be understood by those skilled in the art.

Illustrative Results for Single Channel

The following numbers are used in an illustrative simulation: $L_{pack\_header}$=100 bytes, $L_{min\_pack\_data}$=100 bytes, $L_{max\_pack\_data}$=1400 bytes. $L_{data}$ in the set of {500, 1000, 1500, 2000, 2500, 3000, 3500, 4000} bytes, $\rho_p$ in the set of {0%, 5%, 10%, 15%, 20%, 25%}. The range of N is in {1, . . . 20}, which is typical in an example SD video communication application. Assume that the design requirement in this case is to satisfy the average key frame request longer than 60 seconds when base layer frame rate is 6 frames per second. As shown in Table 3 and Table 4 in FIGS. 9A-10B, the techniques herein are compared with a fixed packetization scheme. Note that in a conventional fixed packetization scheme, given the video data, N data packets with equal size are generated with the constraint that $L_{pack\_data}$ is no bigger than a fixed number of bytes. At that time, M is decided to satisfy the error resilience design requirement adaptively. The video unit size values of 1000 and 500 are used in the simulation for this fixed size. Note that the FEC is still adaptive but in the conventional techniques, the data packetization is fixed. As shown in Table 3 and Table 4, compared with the fixed packetization scheme, the techniques herein can save up to 33% on the bit rate (in video encoding, it generally takes many efforts to achieve even a 5% bit rate saving). Here, by doing an optimal offline design and very simple online implementation, we can save much more bandwidth.

Considering Uplink and Downlinks Jointly

For the third use case described in FIG. 6 above, where the data packets cannot be re-packetized on the server side, the dynamic packetization design needs to consider jointly for both the uplink and the downlink conditions and the overall data rates on all the links. The overall data size here is thus:

$$L_{overall} = \left(N + M_{uplink} + \sum_i \omega_{downlink\_i}(N + M_{downlink\_i})\right) \times (L_{pack\_header} + L_{pack\_data})$$

Equation 7 where $M_{uplink}$ is the M on the uplink that satisfies the requirement and $M_{downlink\_i}$ is the M on the $i^{th}$ downlink that satisfies the requirement given that downlink's condition. $\omega_{downlink\_i}$ is the weighting factor for the $i^{th}$ downlink. If the downlink conditions can be known to the sender, the sender can minimize the $L_{overall}$ on the fly. For the value of $\omega_{downlink\_i}$, it can be equal to 1 for all the downlinks if the overall data size is defined as the sum of the data size of all links. In the case where the server cannot forward the network conditions of the downlinks back to the sender, $\omega_{downlink\_i}$ can then represent the distribution of all possible downlink conditions; where $$\sum_i \omega_{downlink\_i}$$

being set equal to 1 thus treats the uplink more important than the downlinks.

The following steps may be taken to derive the optimal table (245) offline for this joint case:

For all packet loss rate considered, calculate the frame loss rate of all the ((N+M),M) pair that can be implemented;

Given the design criteria, find the minimal M for each N that can satisfy the requirement. All those build up a table of usable ((N+M), M) pairs; and For all video source data size considered (quantized to some ranges), for each uplink packet loss rate, search for the N that can minimize the overall data size $L_{overall}$ with $M_{uplink}$ and each $M_{downlink\_i}$ satisfying the design requirement on each link.

For online implementation, the sender finds the N for the given video data size and the uplink loss rate. The sender will then find the $M_{uplink}$ from the table of usable ((N+M), M) pairs given the uplink loss rate and N. The server will find $M_{downlink\_i}$ for each downlink from the table of usable ((N+M), M) pairs given the downlink loss rate and N.

Illustrative Results for Uplink/Downlinks Joint Design

The following numbers are used in an illustrative simulation: $L_{pack\_header}$=100 bytes, $L_{min\_pack\_data}$=100 bytes, $L_{max\_pack\_data}$=1400 bytes. $L_{data}$ in the set of {500, 1000, 1500, 2000, 2500, 3000, 3500, 4000} bytes, $\rho_p$ in the set of {0%, 5%, 10%, 15%, 20%, 25%}. The range of N is in {1, . . . 20}. The design requirement is to satisfy the average key frame request longer than 60 seconds, with base temporal layer frame rate is 6 frames per second. The techniques herein are again compared with a fixed packtization scheme in Table 5 and Table 6 of FIGS. 11A-12B.

In particular, Table 5 and Table 6 show the simulation results for the case of all $\omega_{downlink\_i}$ equal to 1. This represents the case where the bandwidth sum of all uplink and downlinks is considered. Compared with the fixed packetization scheme, the proposed scheme can save up to 23% on the bit rate. (Note that only M for the uplink is shown in the tables.) Table 5 is a comparison between dynamic packetization and fixed data packetization for joint uplink/downlink consideration, all downlinks equal weighted to one (1000 bytes for fixed), and Table 6 is a similar comparison for 500 bytes for fixed.

Table 7 and Table 8 of FIGS. 13A-14B show the illustrative results that correspond to cases where $$\sum_i \omega_{downlink\_i}$$

equals 1, with $\omega_{downlink\_i}$ set as {60%, 20%, 10%, 5%, 3%, 2%} for the $\rho_p$ set of {0%, 5%, 10%, 15%, 20%, 25%}. Compared with the fixed packetization scheme, the proposed scheme can save up to 23% on the bit rate. (Note again that only M for uplinks is shown in the table.) Specifically, Table 7 is a comparison between dynamic packetization and fixed data packetization for joint uplink/downlink consideration with downlinks statistically weighted (1000 bytes for fixed), while Table 8 shows the same with 500 bytes for fixed.

Illustrative Procedures for Jointly Optimized Packetization and FEC

Figure 15:
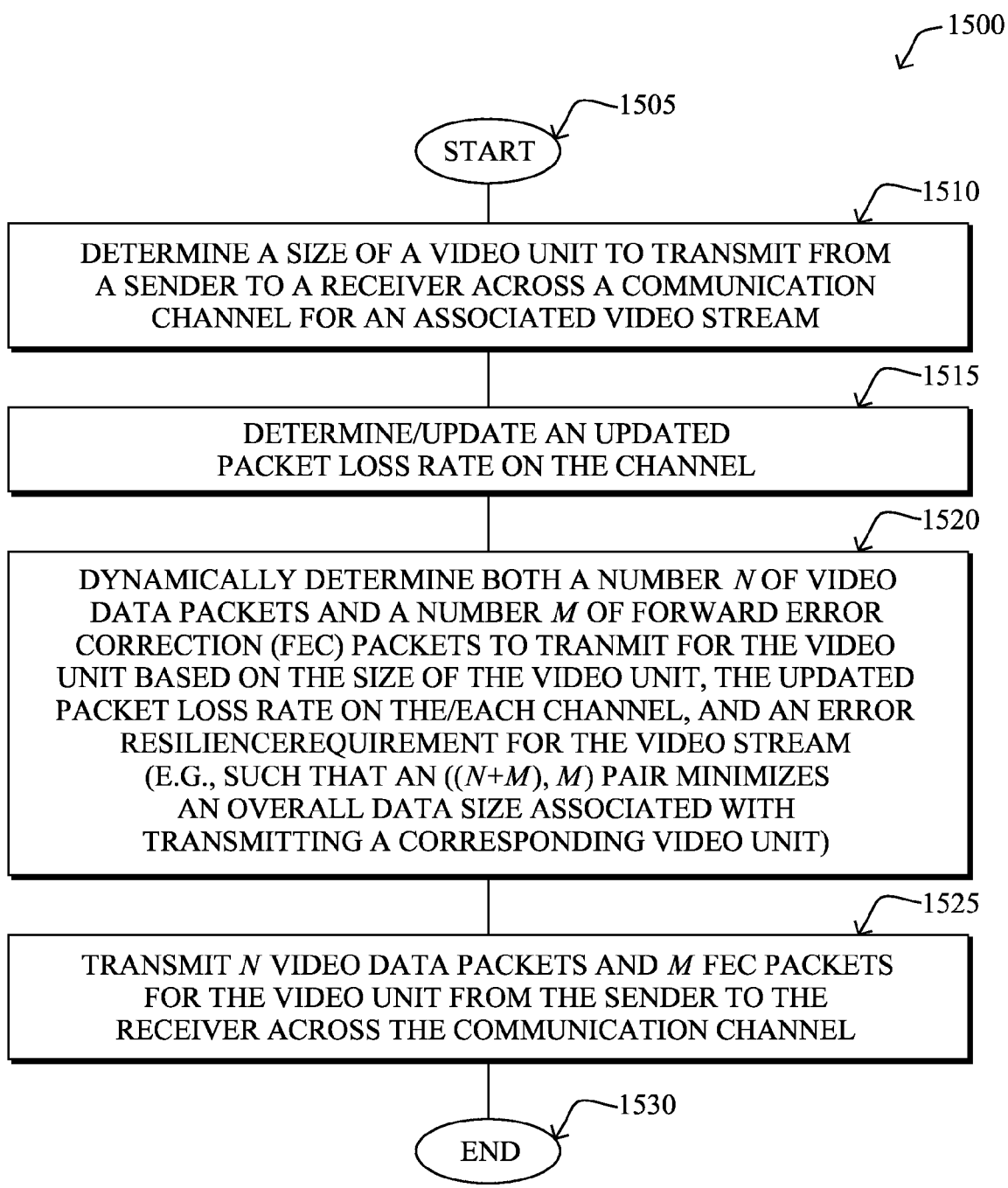
FIGS. 15-16 illustrate example simplified procedures for jointly optimized packetization and forward error correction (FEC) in accordance with one or more embodiments described herein.

FIG. 15 illustrates an example simplified procedure for jointly optimized packetization and FEC in accordance with one or more embodiments described herein. The procedure 1500 starts at step 1505, and continues to step 1510, where, as described in greater detail above, the size of a video unit to transmit from a sender source 110 to a receiver 120 across a communication channel for an associated video stream. In addition, in step 1515, an updated packet loss rate on the channel may also be determined (or updated).

Based on the size of the video unit, the updated packet loss rate on the/each channel, and an error resilience requirement for the video stream, in step 1520 the sender can dynamically determine both a number N of video data packets and a number M of FEC packets to transmit for the video unit. For instance, as described above, N and M can be selected such that an ((N+M), M) pair minimizes an overall data size associated with transmitting a corresponding video unit. Accordingly, in step 1525, the sender transmits N video data packets and M FEC packets for the video unit (e.g., frame) to the receiver across the communication channel, and the procedure 1500 ends in step 1530. Notably, though illustratively "ending" in step 1530, the procedure 1500 may continue/return to any step described above where appropriate. For example, the size of the video unit may change (step 1510), or the packet loss rate may be updated (step 1515), or additional video units may be transmitted (step 1525) where nothing changes but further video frames are received, etc.

Figure 16:
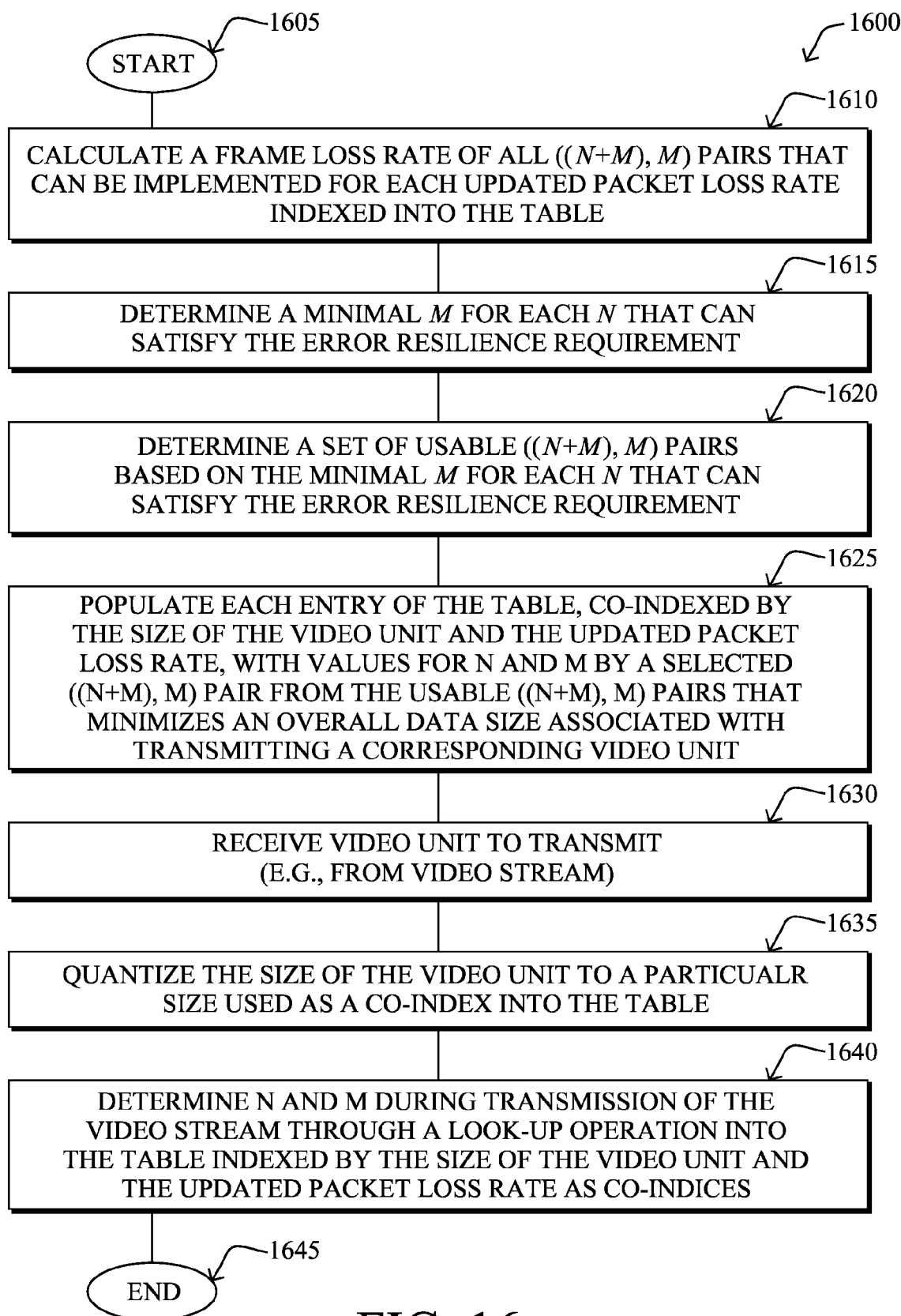

In addition, in accordance with one or more particular illustrative embodiments, such as where a table 245 is created for fast lookup operations during transmission of the video stream, FIG. 16 illustrates another example simplified procedure for use with jointly optimized packetization and FEC. The procedure 1600, which may be complimentary to procedure 1500 of FIG. 15 above, starts at step 1605, and continues to step 1610, where, as described in greater detail above, a frame loss rate is calculated of all ((N+M), M) pairs that can be implemented for each updated packet loss rate indexed into the table. Subsequently, in step 1615 a minimal M is determined for each N that can satisfy the error resilience requirement. As such, in step 1620, a set of usable ((N+M), M) pairs can be determined based on the minimal M for each N that can satisfy the error resilience requirement, and in step 1625 each entry of the table can be populated with values for N and M by a selected ((N+M), M) pair from the usable ((N+M), M) pairs that minimizes an overall data size associated with transmitting a corresponding video unit, where each entry is co-indexed by the size of the video unit and the updated packet loss rate.

Upon receiving a video unit to transmit (e.g., from a video stream) in step 1630, and after quantizing the size of the video unit in step 1635 to a particular size used as a co-index into the table, the sender can determine N and M in step 1640 during transmission of the video stream through a look-up operation into the table indexed by the size of the video unit and the updated packet loss rate as co-indices (e.g., $[L_{data}][\rho_p]$) as described in greater detail above. The illustrative procedure 1600 ends in step 1645, though notably with the possibility (and likelihood) of returning to step 1630 to receive additional video units to transmit without having to correspondingly re-generate the table in steps 1610-1625, as described above.

It should be noted that while certain steps within procedures 1500-1600 may be optional as described above, the steps shown in FIGS. 15-16 are merely examples for illustration, and certain other steps may be included or excluded as desired. Further, while a particular order of the steps is shown, this ordering is merely illustrative, and any suitable arrangement of the steps may be utilized without departing from the scope of the embodiments herein. Moreover, while procedures 1500-1600 are described separately, certain steps from each procedure may be incorporated into each other procedure, and the procedures are not meant to be mutually exclusive.

The techniques described herein thus provide for dynamic and jointly optimized packetization and FEC for packetized video transmissions. In particular, the algorithms herein jointly optimize the source video data packetization and forward error correction (FEC) code in video communication applications, e.g., low-delay video communication. By selecting the best FEC code for the given packet loss rate, while minimizing the overall network bandwidth requirement by dynamic source data packetization, the techniques herein solve the very practical issue faced in (low-delay) video communication with very low complexity (e.g., with offline table design/computation). The techniques described herein also consider the cases of both direct point-to-point signal channel communication and multiple point communication through a media gateway or server. Compared with the state of art adaptive FEC method, which generally utilizes a fixed N value, up to 33% bandwidth savings can be achieved. For a given bandwidth limitation, saving the overall bandwidth significantly in this manner translates to better video quality.

While there have been shown and described illustrative embodiments that jointly optimize packetization and FEC for video communications, it is to be understood that various other adaptations and modifications may be made within the spirit and scope of the embodiments herein. For example, the embodiments have been shown and described herein with relation to certain video-based protocols, and/or to terms currently understood by those skilled in the art. However, the embodiments in their broader sense are not as limited, and may, in fact, be used with other protocols and/or terms of art (whether currently used or defined in the future) to which the techniques herein may be suitably applied. For instance, while the novel techniques defined herein may be applied to video frames, the techniques may also be directed to other granular levels of video units (e.g., regions, macro-blocks, etc.) as may be appropriate, such as where the packetization and/or FEC is based on more granular video units for transmission, accordingly.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/etc.) having program instructions executing on a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A method, comprising:
   determining a size of a video unit to transmit from a sender to a receiver across a communication channel for an associated video stream;
   determining an updated packet loss rate on the channel;
   dynamically determining both a number N of video data packets and a number M of forward error correction (FEC) packets to transmit for the video unit based on the size of the video unit, the updated packet loss rate on the channel, and an error resilience requirement for the video stream; and
   determining N and M during transmission of the video stream through a look-up operation into a table indexed by the size of the video unit and the updated packet loss rate as co-indices, the co-indices co-indexing a pre-determined N and M pair.

2. The method as in claim 1, further comprising:
   generating the table by:
     calculating a frame loss rate of all ((N+M), M) pairs that can be implemented for each updated packet loss rate indexed into the table;
     determining a minimal M for each N that can satisfy the error resilience requirement;
     determining a set of usable ((N+M), M) pairs based on the minimal M for each N that can satisfy the error resilience requirement; and
     populating each entry of the table, co-indexed by the size of the video unit and the updated packet loss rate, with values for N and M by a selected ((N+M), M) pair from the usable ((N+M), M) pairs that minimizes an overall data size associated with transmitting a corresponding video unit.

3. The method as in claim 1, further comprising:
quantizing the size of the video unit to a particular size used as a co-index into the table.

4. The method as in claim 1, wherein dynamically determining both N and M comprises:
selecting N and M such that an ((N+M), M) pair minimizes an overall data size associated with transmitting a corresponding video unit.

5. The method as in claim 1, wherein the sender is a repacketizing server; the method further comprising:
receiving the video stream on an uplink channel from an original sender.

6. The method as in claim 5, further comprising:
independently repacketizing the video stream per each downlink channel of one or more downlink channels from the repacketizing server to one or more corresponding end-point receivers, the repacketizing based on dynamically determining a second number N of video data packets and a second number M of FEC packets to transmit for the video unit based on the size of the video unit, a corresponding updated packet loss rate on each respective downlink channel, and the error resilience requirement for the video stream.

7. The method as in claim 1, wherein the receiver is a non-repacketizing server configured to retransmit video streams to one or more end-point receivers, the method further comprising:
determining N and M for an uplink channel between the sender and non-repacketizing server receiver, wherein the non-repacketizing server is configured to determine a second number M of FEC packets to transmit for the video unit based on the size of the video unit, the number N determined by the sender, the updated packet loss rate on a particular downlink channel from the non-repacketizing server to a particular end-point receiver of the one or more end-point receivers, and the error resilience requirement for the video stream.

8. The method as in claim 7, further comprising:
determining N such that an overall data size associated with transmitting a corresponding video unit is minimized for transmission from the sender to the non-repacketizing server, and from the non-repacketizing server to each of the one or more end-point receivers.

9. The method as in claim 1, further comprising:
updating the updated packet loss rate based on feedback from the receiver.

10. The method as in claim 1, further comprising:
transmitting N video data packets and M FEC packets for the video unit from the sender to the receiver across the communication channel.

11. The method as in claim 1, wherein the video unit is a video frame.

12. A tangible, non-transitory, computer-readable media having software encoded thereon, the software when executed by a processor operable to:
determine a size of a video unit to transmit from a sender to a receiver across a communication channel for an associated video stream;
determine an updated packet loss rate on the channel;
dynamically determine both a number N of video data packets and a number M of forward error correction (FEC) packets to transmit for the video unit based on the size of the video unit, the updated packet loss rate on the channel, and an error resilience requirement for the video stream; and
determine N and M during transmission of the video stream through a look-up operation into a table indexed by the size of the video unit and the updated packet loss rate as co-indices, the co-indices co-indexing a pre-determined N and M pair.

13. The computer-readable media as in claim 12, wherein the software when executed is further operable to:
generate the table by:
calculating a frame loss rate of all ((N+M), M) pairs that can be implemented for each updated packet loss rate indexed into the table;
determining a minimal M for each N that can satisfy the error resilience requirement;
determining a set of usable ((N+M), M) pairs based on the minimal M for each N that can satisfy the error resilience requirement; and
populating each entry of the table, co-indexed by the size of the video unit and the updated packet loss rate, with values for N and M by a selected ((N+M), M) pair from the usable ((N+M), M) pairs that minimizes an overall data size associated with transmitting a corresponding video unit.

14. The computer-readable media as in claim 12, wherein the software when executed is further operable to:
quantize the size of the video unit to a particular size used as a co-index into the table.

15. The computer-readable media as in claim 12, wherein the software when executed to dynamically determine both N and M is further operable to:
select N and M such that an ((N+M), M) pair minimizes an overall data size associated with transmitting a corresponding video unit.

16. The computer-readable media as in claim 12, wherein the software when executed is further operable to:
receive the video stream on an uplink channel from an original sender as a repacketization server; and
independently repacketize the video stream per each downlink channel of one or more downlink channels from the repacketizing server to one or more corresponding end-point receivers, the repacketizing based on dynamically determining a second number N of video data packets and a second number M of FEC packets to transmit for the video unit based on the size of the video unit, a corresponding updated packet loss rate on each respective downlink channel, and the error resilience requirement for the video stream.

17. The computer-readable media as in claim 12, wherein the receiver is a non-repacketizing server configured to retransmit video streams to one or more end-point receivers, and wherein the software when executed is further operable to:
determine N and M for an uplink channel between the sender and non-repacketizing server receiver, wherein the non-repacketizing server is configured to determine a second number M of FEC packets to transmit for the video unit based on the size of the video unit, the number N determined by the sender, the updated packet loss rate on a particular downlink channel from the non-repacketizing server to a particular end-point receiver of the one or more end-point receivers, and the error resilience requirement for the video stream.

18. The computer-readable media as in claim 17, wherein the software when executed is further operable to:
determine N such that an overall data size associated with transmitting a corresponding video unit is minimized for transmission from the sender to the non-repacketizing server, and from the non-repacketizing server to each of the one or more end-point receivers.

19. The computer-readable media as in claim 12, wherein the software when executed is further operable to:
   update the updated packet loss rate based on feedback from the receiver.

20. The computer-readable media as in claim 12, wherein the software when executed is further operable to:
   transmit N video data packets and M FEC packets for the video unit from the sender to the receiver across the communication channel.

21. The computer-readable media as in claim 12, wherein the video unit is a video frame.

22. An apparatus, comprising:
   an input configured to receive a video stream;
   a processor coupled to the input and configured to execute one or more processes; and
   a memory configured to store a process executable by the processor, the process when executed operable to:
      determine a size of a video unit to transmit from the apparatus to a receiver across a communication channel for an associated video stream;
      determine an updated packet loss rate on the channel;
      dynamically determine both a number N of video data packets and a number M of forward error correction (FEC) packets to transmit for the video unit based on the size of the video unit, the updated packet loss rate on the channel, and an error resilience requirement for the video stream; and
      determine N and M during transmission of the video stream through a look-up operation into a table indexed by the size of the video unit and the updated packet loss rate as co-indices, the co-indices co-indexing a pre-determined N and M pair.

23. The apparatus as in claim 22, wherein the process when executed is further operable to:
   generate the table by:
      calculating a frame loss rate of all ((N+M), M) pairs that can be implemented for each updated packet loss rate indexed into the table;
      determining a minimal M for each N that can satisfy the error resilience requirement;
      determining a set of usable ((N+M), M) pairs based on the minimal M for each N that can satisfy the error resilience requirement; and
      populating each entry of the table, co-indexed by the size of the video unit and the updated packet loss rate, with values for N and M by a selected ((N+M), M) pair from the usable ((N+M), M) pairs that minimizes an overall data size associated with transmitting a corresponding video unit.

* * * * *